United States Patent [19]

Van de Donk et al.

[11] 4,389,719
[45] Jun. 21, 1983

[54] OPTICALLY READABLE INFORMATION DISK

[75] Inventors: Michael J. C. Van de Donk; Hendricus C. A. M. Heinemans; Petrus E. J. Legierse, all of Eindhoven, Netherlands

[73] Assignee: U.S. Philips Corporation, New York, N.Y.

[21] Appl. No.: 185,052

[22] Filed: Sep. 8, 1980

[30] Foreign Application Priority Data

Apr. 8, 1980 [NL] Netherlands ..................... 8002039

[51] Int. Cl.³ ............................................. B32B 15/08
[52] U.S. Cl. .................................. 369/275; 428/463; 428/522; 428/64; 428/913; 369/284; 369/286
[58] Field of Search ................. 428/463, 913, 64, 497, 428/520, 522, 172; 369/284, 286, 275

[56] References Cited

U.S. PATENT DOCUMENTS

| 2,002,620 | 5/1935 | Whitaker. | |
|---|---|---|---|
| 4,158,715 | 6/1979 | Smith et al. | 428/463 |
| 4,175,145 | 11/1979 | Fetchter | 428/409 |
| 4,188,433 | 2/1980 | Dijkstra et al. | 428/463 |
| 4,272,574 | 6/1981 | Lippits | 369/275 |

Primary Examiner—George F. Lesmes
Assistant Examiner—E. Rollins Buffalow
Attorney, Agent, or Firm—Norman N. Spain

[57] ABSTRACT

An optically readable information disk which comprises a transparent substrate plate (1) of PVC or a copolymer of vinyl chloride which is provided on one side with a reflecting optical structure (2–5) and on the other side with a radiation-cured lacquer layer (6) which is transparent to the laser light (7) used.

3 Claims, 3 Drawing Figures

OPTICALLY READABLE INFORMATION DISK

The invention relates to an optically readable information disk comprising a transparent substrate plate of polyvinyl chloride or a copolymer of vinyl chloride which is provided on one side with a reflecting optical structure which is read via the substrate plate by means of laser light.

Such an information disk is known from Netherlands Patent Application No. 7611395 (PHN 8576) filed in the name of Applicants and laid open to public inspection. In this known disk the reflecting optical structure is formed by a radiation-cured lacquer layer in which the information track is provided and have which is covered with a reflection layer of, for example, Ag or Al. The information track has a crenelated profile of information areas (bits) which are situated alternately at a higher and a lower level and which are read in reflection on the basis of phase differences by means of laser light focused on the reflecting optical structure through the substrate plate. The substrate plate is transparent to the laser light used. The speed of the disk upon reading (playing back) is approximately 500–2,000 r.p.m. When reading video information, the signal originating from the disk or record has a frequency in the order of magnitude of 4–12 MHz.

During playing back of the record, the reading laser light beam is kept in the correct position by a control mechanism which is influenced by so-called servo signals originating from the record. So there are different servo signals for radially following the track by the reading beam, for tangentially following the track, as well as on behalf of the focusing of the laser light beam on the reflecting optical structure. The servo signals are usually obtained by using several auxiliary laser light beams, sometimes termed servo beams, which are focused on or near the information track. As soon as deviations occur, for example, if the reading laser light is no longer readily centred on the information track, signal differences occur between the servo beams, for example, a difference in the amount of reflected light. On the basis of this difference, for example, a mirror is controlled with which the position of the reading beam is corrected. The servo signals show a low frequency in the order of magnitude of at most 3 KHz.

Applicants have found that a strong noise in the servo signals, hereinafter called servo noise, occurs in optically readable information disks which comprise a transparent substrate of PVC or of a copolymer of vinyl chloride, for example the copolymer of vinyl chloride-vinyl acetate. This servo noise impedes the playing-back of the record and gives a significant increase of the number of play-back errors. It has notably been found that the frequency of the servo noise is of the same order of magnitude as that of the servo signal, so that the noise cannot be filtered. Further sometimes, the amplitude of the output signal, i.e. the noise signal superimposed on the servo signal, reaches values which correspond to the amplitude of the so-called flipping pulse, i.e. the pulse with which the reading beam is set on a different track. It is to be noted that the flipping pulse is used to obtain stationary images, or for an accelerated or retarded display of information. So the servo noise also has for its result that an undesired stationary, accelerated or retarded image is obtained.

It is the object of the invention to provide an information disk in which the above-mentioned servo noise is considerably suppressed or is even removed.

This object is achieved with an optically readable information disk of the type mentioned in the opening paragraph and which is characterized in that the substrate plate, on its surface remote from the optical structure, comprises a radiation-cured lacquer layer which is transparent to the laser light used.

The measure according to the invention is based on the applicants recognition that the quality of the surface of the substrate remote from the optical structure has a decisive influence on the quality of the servo signals.

According to the current knowledge, this surface is optically of no significance because it is situated beyond the depth of focus of the objective which focuses the laser light. Thus any scratches or other contaminations of the surface are optically not visible and should have no detrimental influence on the quality of the information to be read.

Applicants have come to the conviction that a pattern of fine scratches having a mutual distance between the irregularities of approx. 1–50 $\mu$m produces at speeds of 500–2,000 r.p.m., a low-frequency interference signal which leads to the above-mentioned servo noise.

Measurements have demonstrated that the amplitude of the servo signals has a sinusoidal variation in which per revolution of the information disk, or in other words per track sector of 360°, two areas having a comparatively high amplitude and two areas having a comparatively low amplitude are to be distinguished. In applicants' opinion this phenomenon can be explained by means of the above-mentioned pattern of fine scratches. In fact, per track sector of 360° two areas are distinguished where the scratches extend substantially parallel to the servo laser light and two areas where the servo laser light crosses the grooves substantially at right angles. In the first-mentioned two areas little servo noise will occur (loops in the sine variation), while in the last-mentioned areas many scratches are encountered and the servo noise is maximum (knots of sine line).

Substrates of PVC and copolymers of vinyl chloride show a very fine pattern of scratches which is the result of the mechanical treatments used during the manufacture of the substrates. For example, in the calendering process polished rollers are used which are usually manufactured from metal, for example, brass or stainless steel. It has been found that the direction of polishing of the roller can be observed in the calendered substrate foils in the form of very fine scratches extending substantially parallel.

The radiation-curable lacquer which is used in the manufacture of the lacquer layer according to the invention preferably comprises radiation-curable acrylic acid esters. After curing by means of radiation, for example ultraviolet light, the cured lacquer shows a cross-link structure. The lacquer is transparent, readily adheres to PVC and has a favourable index of refraction.

Readily useful lacquer compositions on the basis of acrylic acid esters are described inter alia in Netherlands Patent Application No. 7611395 (PHN 8576) filed in the name of Applicants corresponding to U.S. Pat. No. 4,275,091.

The lacquer can be provided on the PVC substrate in various known manners, for example by means of a dipping or spraying process. Good results are obtained in particular by means of the roller method.

According to the last-mentioned method, a small quantity of lacquer is provided centrally on a circular glass plate having a readily defined, very smooth surface. The PVC substrate which is to be provided on one side with a lacquer layer, is bent spherically and pressed against the lacquer in the glass plate. First the centre of the PVC substrate will be contacted with the central part of the glass plate. When the bent PVC is further moved in the direction of the glass plate, the lacquer present on the glass plate will be rolled over the whole surface, the lacquer front being circular. The PVC substrate will simultaneously become smooth. In the final position the PVC substrate lies entirely flat and without stress on the rolled lacquer layer.

The lacquer layer is cured by exposure to, for example, ultraviolet light, after which the glass plate is removed. The exposure may be done either through the glass plate or through the PVC substrate.

The PVC or copolymer of vinyl chloride used in the information disk according to the invention has the advantage of a very small moisture sensitivity, in contrast with, for example, the much more moisture-sensitive polymethylmethacrylate (PMMA). A substrate plate of hard PVC is preferably used, i.e. PVC with little or no polyvinyl alcohol, for example, the hard PVC known by the tradename of Adriavyl. However, such a PVC plate exhibits a considerable amount of birefringence, roughly up to 1,000 nm, which is due to the stresses present in the PVC plate which result from the above-mentioned method of preparing in which a rolling and calendering process are used (orientation birefringence). Birefringence is undesirable in optical applications. In order to avoid this disadvantage, in a preferred form of the information disk according to the invention, a substrate plate is used which is built up from an even number of stacked foils of calendered hard PVC which are compressed to form a single assembly, the directions of stretching of the successive calendred foils being at right angles to each other. The substrate plate comprises as a rule 2-6 foils and in particular 4 foils of calendered hard PVC. The overall thickness of such a substrate plate is approx. 1.3 mm. The birefringence of the individual foils is removed mutually so that the substrate plate in all has no or no noteworthy birefringence.

The invention will be described in greater detail with reference to the drawing, in which.

Figure 1:
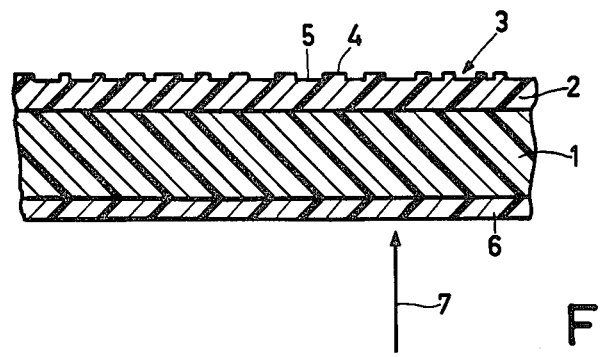
FIG. 1 is a cross-sectional view of an information disk.

Reference numeral 1 in FIG. 1 denotes a PVC substrate plate, 1.3 mm thick, which is constructed from four compressed foils of hard PVC. The substrate 1 is provided on one side with an U.V. light-cured lacquer layer 2, thickness 30 μm, in which an optically readable information track 3 is provided. The information track has a crenelated profile of information areas (blocks) 4 situated at a higher level and information areas 5 (pits) situated at a lower level. The longitudinal dimensions of pits and blocks correspond to the stored information and vary roughly from 0.1 to 3 μm. The difference in height between blocks and pits is ¼ wavelength of the reading laser light, which means a difference of 0.1-0.3 μm. The lacquer layer 2 is covered with a reflection layer not shown which is formed by a 60 nm thick Al-layer.

On its surface remote from the optical structure 2 the substrate plate 1 has a 20 μm thick layer of an UV light-cured lacquer of the following composition:

58% by weight ethyl hexylacrylate
20% by weight butanediolacrylate
20% by weight trimethylol propanetriacrylate
2% by weight catalyst (Vicure 10)

The information disk is read in reflection on the basis of phase differences, the reading laser light beam denoted by the arrow 7 being focused on the information track 3 via lacquer layer 6 and substrate plate 1.

Figure 2:
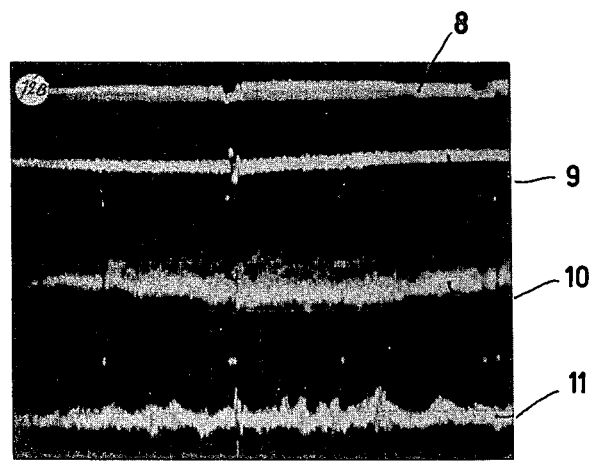
FIG. 2 is a photograph of the servo noise of a disk according to the invention.

FIG. 2 is a photograph showing the various signals obtained upon reading the disk shown in FIG. 1. The disk is read at a speed of 1,800 r.p.m. The signal characteristic shown in FIG. 2 relates to signals obtained during one revolution of the disk, that is to say, upon reading a complete video image. The video (image) signal is referenced 8, the radial servo signal is referenced 9, the tangential tracing signal is referenced 10 and the focusing signal is referenced 11.

Figure 3:
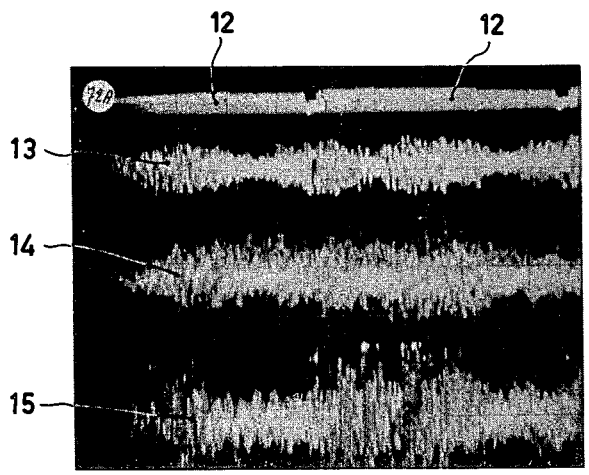
FIG. 3 is a photograph of the servo noise of an information disk which is not provided with a cured lacquer layer on the reading side.

FIG. 3 is a photograph showing the same data as in FIG. 2, with the difference that the data of FIG. 3 relate to an information disk as shown in FIG. 1 which is not provided with lacquer layer 6. The video signal is referenced 12, the radial servo signal is referenced 13, the tangential servo signal is referenced 14 and the focusing signal is referenced 15. Attention is invited to the sinusoidal variation of notably the radial tracing signal.

From a comparison of FIGS. 2 and 3 it will be obvious that the noise of the servo signals is suppressed very considerably when an information disk according to the invention is used.

What is claimed is:

1. An optically readable information disk consisting essentially of a transparent substrate plate of polyvinyl chloride or a copolymer of vinyl chloride provided on one side with a reflecting optical structure comprising a radiation cured lacquer layer containing an information track having a crenelated profile of information areas situated alternatively at a higher and a lower level and a reflecting layer located on said radiation cured lacquer layer, said information track being readable by reflective laser light through said substrate plate, and, on the surface of the substrate plate remote from the optical structure a radiation cured lacquer layer transparent to the laser light employed.

2. An optically readable information disk as claimed in claim 1, characterized in that the substrate plate is built up from an even number of stacked foils of calendered hard PVC which are compressed to form one assembly, the directions of stretching of the successive calendered foils being at right angles to each other.

3. An optically readable information disk as claimed in claim 1 or 2, characterized in that the lacquer layer comprises radiation-curable acrylic acid esters.

* * * * *

UNITED STATES PATENT AND TRADEMARK OFFICE
CERTIFICATE OF CORRECTION

PATENT NO. : 4,389,719
DATED : June 21, 1983
INVENTOR(S) : MICHAEL J.C. VAN DE DONK ET AL It is certified that error appears in the above—identified patent and that said Letters Patent is hereby corrected as shown below:

Column 4, Line 61 after "layer" insert
--on the surface of the substrate plate
remote from the optical structure--

Signed and Sealed this

Twenty-seventh Day of September 1983

[SEAL]

Attest:

GERALD J. MOSSINGHOFF

Attesting Officer   Commissioner of Patents and Trademarks